US010690852B2

(12) United States Patent
Van Campenhout et al.

(10) Patent No.: US 10,690,852 B2
(45) Date of Patent: Jun. 23, 2020

(54) III-V SEMICONDUCTOR WAVEGUIDE NANORIDGE STRUCTURE

(71) Applicant: IMEC vzw, Leuven (BE)

(72) Inventors: Joris Van Campenhout, Brussels (BE);
Ashwyn Srinivasan, Heverlee (BE);
Bernardette Kunert, Wilsele (BE);
Maria Ioanna Pantouvaki, Kessel-lo (BE)

(73) Assignees: IMEC vzw, Leuven (BE); Universiteit Gent, Ghent (BE)

( * ) Notice: Subject to any disclaimer, the term of this patent is extended or adjusted under 35 U.S.C. 154(b) by 0 days.

(21) Appl. No.: 16/228,486

(22) Filed: Dec. 20, 2018

(65) Prior Publication Data
US 2019/0219846 A1    Jul. 18, 2019

(30) Foreign Application Priority Data

Dec. 29, 2017  (EP) ..................... 17211015

(51) Int. Cl.
*G02B 6/13* (2006.01)
*G02F 1/025* (2006.01)
(Continued)

(52) U.S. Cl.
CPC ............... *G02B 6/13* (2013.01); *G02B 6/131* (2013.01); *G02F 1/025* (2013.01);
(Continued)

(58) Field of Classification Search
CPC ...................................... G02B 6/13;
G02B 6/131; G02B 2006/12097; G02B 2006/12128; G02B 2006/12178; G02F 2001/01791
(Continued)

(56) References Cited

U.S. PATENT DOCUMENTS 4,749,441 A * 6/1988 Christenson ...... H01L 21/76264
117/923
5,166,081 A * 11/1992 Inada .................. H01L 29/0804
148/DIG. 10
(Continued)

FOREIGN PATENT DOCUMENTS

EP  2015116 A2  1/2009
EP  2015116 A3  1/2010
(Continued)

OTHER PUBLICATIONS

"Electrically pumped hybrid AlGaInAs-silicon evanescent laser" by Fang et al, Optics Express, vol. 14, No. 20, pp. 9203-9210, 2006.*
(Continued)

*Primary Examiner* — Robert Tavlykaev
(74) *Attorney, Agent, or Firm* — Knobbe Martens Olson & Bear LLP

(57) ABSTRACT

A III-V semiconductor waveguide nanoridge structure having a narrow supporting base with a freestanding wider body portion on top, is disclosed. In one aspect, the III-V waveguide includes a PIN diode. The waveguide comprises a III-V semiconductor waveguide core formed in the freestanding wider body portion; at least one heterojunction incorporated in the III-V semiconductor waveguide core; a bottom doped region of a first polarity positioned at a bottom of the narrow supporting base, forming a lower contact; and an upper doped region of a second polarity, forming an upper contact. The upper contact is positioned in at least one side wall of the freestanding wider body portion.

21 Claims, 10 Drawing Sheets

(51) Int. Cl.
   *G02B 6/12* (2006.01)
   *G02F 1/017* (2006.01)
(52) U.S. Cl.
   CPC ............. *G02B 2006/12097* (2013.01); *G02B 2006/12128* (2013.01); *G02B 2006/12178* (2013.01); *G02F 2001/01791* (2013.01)
(58) Field of Classification Search
   USPC .................................................. 385/130–132
   See application file for complete search history.

(56) References Cited

U.S. PATENT DOCUMENTS

| | | | | |
|---|---|---|---|---|
| 6,108,361 | A * | 8/2000 | Fujihara | ................. B82Y 20/00 372/46.01 |
| 7,072,557 | B2 * | 7/2006 | Nagarajan | .......... G02B 6/12004 385/131 |
| 8,587,092 | B2 * | 11/2013 | Makiyama | ............. C23C 16/345 257/640 |
| 2002/0054724 | A1 * | 5/2002 | Tada | ........................ G02F 1/025 385/2 |
| 2004/0218259 | A1 | 11/2004 | Hui et al. | |
| 2004/0258344 | A1 | 12/2004 | Fardi et al. | |
| 2008/0093622 | A1 * | 4/2008 | Li | ..................... H01L 21/02381 257/103 |
| 2008/0187018 | A1 * | 8/2008 | Li | ..................... H01L 21/02381 372/50.11 |
| 2010/0216277 | A1 * | 8/2010 | Fiorenza | ........... H01L 21/02381 438/94 |
| 2014/0291616 | A1 * | 10/2014 | Park | .................. H01L 29/66356 257/27 |
| 2016/0087160 | A1 | 3/2016 | Cheng et al. | |
| 2018/0090910 | A1 * | 3/2018 | Nakahara | .................. H01S 5/24 |

FOREIGN PATENT DOCUMENTS

| | | |
|---|---|---|
| EP | 2985645 A1 | 2/2016 |
| JP | 2006 235379 A | 9/2006 |

OTHER PUBLICATIONS

Extended European Search Report for Application No. 17211015.7; dated Jul. 2, 2018.

* cited by examiner

III-V SEMICONDUCTOR WAVEGUIDE NANORIDGE STRUCTURE

CROSS-REFERENCE TO RELATED APPLICATIONS

This application claims foreign priority to European Application EP 17211015.7, filed on Dec. 29, 2017, which is incorporated herein by reference in its entirety.

BACKGROUND

Technological Field

The disclosed technology relates to photonic systems, and more particularly, to III-V semiconductor nanoridge waveguide structures with efficient current injection and/or limited non-radiative recombination, as well as methods of making them.

Description of the Related Technology

Photonic systems serve a wide set of applications. They are advantageously used to implement optical or electro-optical functionalities in a compact way. One highly prospective photonic systems, targeting tele- and datacom as well as optical sensing, is the emerging platform based on silicon. Silicon photonics leverages the CMOS manufacturing infrastructure to realize photonic integrated circuits, typically using indirect bandgap group-IV semiconductor materials to realize passive waveguide functionality as well as active electro-optical functionality such as light modulation and light detection.

For applications requiring light generation and light amplification, and to a lesser extent high-performance light modulation and absorption, it is preferable to use direct bandgap III-V material waveguides to realize these active functionalities. Nevertheless, the manufacturing and integration of high-quality III-V semiconductor material waveguides on the silicon photonics platform is challenging and cumbersome. Although a number of attempts have been made in the past, there is no appropriate solution available yet.

III-V semiconductor nanoridge waveguide structures are photonic structures that are particularly useful for forming active waveguides on a monolithic integrated photonic system. Nevertheless, currently such III-V semiconductor nanoridge waveguide structures still suffer from limited injection efficiency and from loss of efficiency due to non-radiative combination.

Consequently, there is still room for improvement.

SUMMARY OF CERTAIN INVENTIVE ASPECTS

One objective of some aspects of the disclosed technology is to provide III-V semiconductor nanoridge waveguides with a good current injection efficiency and/or limited non-radiative recombination, as well as monolithically integrated photonic devices comprising such III-V semiconductor nanoridge waveguides and methods of producing such III-V semiconductor nanoridge waveguides.

The above objective is accomplished by a method and a system according to the disclosed technology.

The disclosed technology relates to a III-V semiconductor waveguide, the III-V semiconductor waveguide being a nanoridge structure having a narrow supporting base with a freestanding wider body portion on top, and having a PIN diode. the III-V semiconductor waveguide comprises a III-V semiconductor waveguide core formed in the freestanding wider body portion; at least one heterojunction incorporated in the III-V semiconductor waveguide core; a bottom doped region of a first polarity positioned at a bottom of the narrow supporting base forming a lower contact; and an upper doped region of a second polarity forming an upper contact, the upper contact positioned in at least one side wall of the freestanding wider body portion.

The upper contact may be in direct contact with the freestanding wider body portion.

The at least one heterojunction(s) may comprise one or more active quantum wells or quantum dots. The heterojunction may be a junction between bulk materials.

It is an advantage of the disclosed technology that active multiple quantum wells or quantum dots are incorporated into the III-V semiconductor waveguide cores, guaranteeing a good overlap of the well-confined mode field and the active region, such that efficient optical gain or optical absorption can be achieved.

It is a further advantage of the disclosed technology that there is an efficient electron and hole injection in the quantum well active layers or electron and hole collection.

It is a further advantage of the disclosed technology that there is a reduction of excessive non-radiative recombination.

It is a further advantage of the disclosed technology that the III-V semiconductor waveguides are selectively grown as nanoridge structures. As used herein, a nanoridge structure means a structure having a narrow supporting base with a freestanding wider body portion on top, wherein at least one dimension of the smaller body portion has a nano-size dimension. For example, it may consist of a supporting III-V semiconductor bottom fin portion grown inside nano-confined trenches and a freestanding body portion on top of the trench pattern with increased III-V semiconductor volume. The III-V semiconductor growth inside narrow trenches (bottom fin) with an aspect ratio larger than 1 guarantees an efficient trapping filter for misfit and threading dislocation defects, so that the out-grown material (freestanding body) on top of the trench pattern is free of defects. The growth out of the trench can be manipulated to form a nanoridge with different shapes, which are vertically and laterally broadened with respect to the bottom fin to enable efficient wave guidance. The nanoridge shape may be a triangular, box-like, diamond-like, or ridge-like cross-section with a hat-like or a flat top surface.

The upper contact may be positioned in at least a side wall and on a top side of the freestanding wider body portion. As used herein, a top side means a side opposite the narrow supporting base.

The upper contact may be positioned on a top side and in at least two side walls of the freestanding wider body portion. It is an advantage of the disclosed technology that the injection in the nanoridge III-V semiconductor waveguide is more uniform compared to a waveguide having only a contact at the top of the waveguide core.

The upper contact may be positioned on different planes forming the edge of the freestanding wider body portion so as to form an upper contact wrapped around at least a portion of the freestanding wider body portion.

The upper contact may wrap around the region of the waveguide core comprising the at least one heterojunction(s).

The upper contact may encapsulate the freestanding wider body portion.

The upper contact may be a n-type contact while the lower contact is a p-type contact. Alternatively, the upper contact may be a p-type contact while the lower contact is a n-type contact.

The n-type contact may be a contact fin from n+ implanted silicon and/or the p-type contact may be a contact implemented in an in-situ p+ doped, low bandgap III-V semiconductor fin.

Alternatively, the p-type contact may be a contact fin from p+ implanted silicon and/or the n-type contact may be a contact implemented in an in-situ n+ doped, low bandgap III-V semiconductor fin.

According to the disclosed technology, the contacts may be low resistance contacts causing no significant optical excess loss that are provided to the active III-V waveguide.

The III-V waveguide core may be formed of a material comprising GaAs and the active quantum wells or quantum dots may be one or more of the following: InGaAs quantum wells, InAs quantum dots, InGaAs/GaSbAs quantum wells or InGaNAs quantum wells.

The III-V waveguide core may be formed of a material comprising InP and the active quantum wells or quantum dots may be one or more of the following: InGaAs quantum wells, InGaAsP quantum wells, InAs quantum dots, or AlGaInAs quantum wells.

The III-V waveguide core may be formed of a material comprising InAs and the active quantum wells or quantum dots may be InGaSbAs quantum wells.

The III-V waveguide core may be formed of a material comprising GaSb and the active quantum wells or quantum dots may be InGaSbAs quantum wells.

The semiconductor waveguide may further comprise a passivation layer covering at least part of the freestanding wider body portion. The passivation layer may be fully covering the upper contact.

In one embodiment, the p-i-n junction is embedded in the III-V semiconductor waveguide to enable carrier injection and population inversion in the embedded quantum wells or quantum dots upon forward biasing the diode, achieving optical gain in the active waveguide. In another embodiment, the p-i-n junction is embedded in the III-V semiconductor waveguide to enable extraction of photo-generated carriers from the embedded quantum wells or quantum dots upon reverse biasing the diode, achieving photo detection in the active waveguide. In yet another embodiment, the p-i-n junction is embedded in the III-V semiconductor waveguide to enable strong electric field modulation in the embedded quantum wells or quantum dots upon reverse biasing the diode, achieving optical absorption modulation in the active waveguide based on well-known electro-optical effects in III-V semiconductor materials such as the Franz-Keldish or Quantum-Confined Stark Effect.

The disclosed technology further relates to a photonic device comprising a III-V semiconductor waveguide as described above.

The photonic device may comprise a patterned semiconductor substrate whereon the III-V semiconductor waveguide is grown. The semiconductor substrate may be a silicon substrate. The photonic device may be a silicon or silicon nitride based photonic device.

It is an advantage of the disclosed technology that the III-V semiconductor nanoridge waveguides can be seeded on the {111} facets of a V-shaped silicon surface as the {111} facets of the silicon surface exclude the presence of antiphase boundaries. Alternatively, the deposition can be made on a flat {001} silicon surface. The trench side walls in such embodiments can also trap antiphase boundaries.

The photonic device may further comprise narrow trenches with widths ranging from 20 nm to 500 nm and with heights ranging from 100 nm to 500 nm from which the III-V semiconductor waveguide is monolithically grown.

The photonic device may be a monolithic integrated active/passive waveguide photonic device further comprising a passive waveguide and configured to couple radiation between the passive waveguide and the active III-V semiconductor waveguide.

It is an advantage of the disclosed technology that it can combine active, direct bandgap III-V material based, structures showing better light generation and absorption efficiencies, and passive crystal silicon structures showing low losses on a single platform. It is a further advantage of the disclosed technology that active III-V material can be directly and selectively grown on a patterned silicon substrate.

The passive waveguide may be a silicon or silicon nitride waveguide.

The photonic device may comprise any of the following: a semiconductor optical amplifier, a laser diode, an electro-absorption modulator, a photodetector, or an optical transceiver.

The disclosed technology further relates to a method of manufacturing a photonic device comprising a III-V semiconductor waveguide. The method comprises: providing a substrate; and monolithically integrating, on the substrate, a III-V semiconductor nanoridge waveguide. The monolithic integration comprises: growing a freestanding wider body portion of III-V semiconductor material and at least one heterojunction forming one or more active quantum wells or quantum dots incorporated therein; and growing a doped layer on at least a side wall of the freestanding wider body portion to form a contact on the freestanding wider body portion.

Growing a doped layer may comprise epitaxially growing a layer at least partly wrapping the freestanding wider body portion.

Monolithically integrating, on the substrate, a III-V semiconductor nanoridge waveguide may comprise growing the freestanding wider body portion vertically and laterally from a supporting bottom fin portion, the supporting bottom fin portion being in contact with the substrate.

Monolithic integration may comprise growing the III-V semiconductor nanoridge waveguide monolithically in narrow trenches with widths ranging from 20 nm to 500 nm and with heights ranging from 100 nm to 500 nm.

Monolithic integration may comprise growing the III-V semiconductor nanoridge waveguide seeded on a {111} facets of a V-shaped Si surface.

Monolithic integration may comprise growing the III-V semiconductor nanoridge waveguide by any of the following: metal organic vapor phase epitaxy, molecular beam epitaxy, or hybrid vapor phase epitaxy.

Integration may comprise fabricating active III-V nanoridge waveguides comprising a freestanding body portion and a supporting bottom fin portion, wherein the freestanding body portion of the nanoridge waveguide is growing out vertically and laterally from the supporting bottom fin portion of the nanoridge waveguide, the supporting bottom fin portion being in contact with the substrate.

Certain aspects of the disclosed technology are set out in the accompanying independent and dependent claims. Features from the dependent claims may be combined with features of the independent claims and with features of other dependent claims as appropriate and not merely as explicitly set out in the claims.

For purposes of summarizing the disclosed technology and the advantages achieved over the prior art, certain objectives and advantages of the disclosed technology have been described above. Of course, it is to be understood that not necessarily all such objectives or advantages may be achieved in accordance with any particular embodiment of the disclosed technology. Thus, for example, those skilled in the art will recognize that the disclosed technology may be embodied or carried out in a manner that achieves or optimizes one advantage or a group of advantages as taught herein without necessarily achieving other objectives or advantages as may be taught or suggested herein.

The above and other aspects of the disclosed technology will be apparent from and elucidated with reference to the embodiment(s) described hereinafter.

BRIEF DESCRIPTION OF THE DRAWINGS

The disclosed technology will now be described further, by way of example, with reference to the appended drawings, in which.

Figure 1:
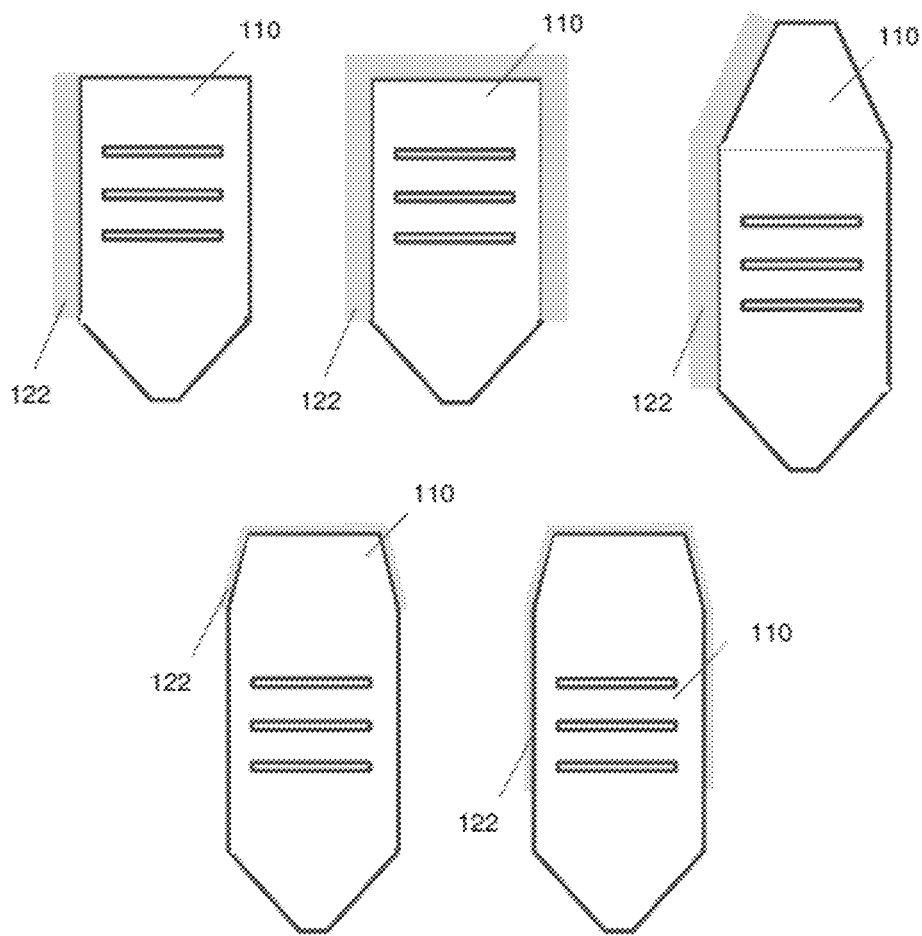
FIG. 1 illustrates examples of different freestanding wide body portions and possible upper contacts, according to embodiments of the disclosed technology.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the disclosed technology.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The disclosed technology will be described with respect to exemplary embodiments and with reference to certain drawings, but the disclosed technology is not limited thereto but only by the claims.

The terms first, second, and the like in the description and in the claims are used to distinguish between similar elements and not necessarily for describing a sequence, whether temporally, spatially, in ranking, or in any other manner. It is to be understood that the terms so used are interchangeable under appropriate circumstances and that the embodiments of the disclosed technology described herein are capable of operation in other sequences than described or illustrated herein.

Moreover, directional terminology such as top, bottom, front, back, leading, trailing, under, over, and the like in the description and the claims is used for descriptive purposes with reference to the orientation of the drawings being described, and not necessarily for describing relative positions. Because components of the embodiments can be positioned in a number of different orientations, the directional terminology is used for purposes of illustration only, and is in no way intended to be limiting, unless otherwise indicated. It is, hence, to be understood that the terms so used are interchangeable under appropriate circumstances and that the embodiments of the disclosed technology described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the disclosed technology, the only relevant components of the device are A and B.

Reference throughout this specification to "one embodiment" or "an embodiment" means that a particular feature, structure, or characteristics described in connection with the embodiment is included in at least one embodiment of the disclosed technology. Thus, appearances of the phrases "in one embodiment" or "in an embodiment" in various places throughout this specification may or may not necessarily all refer to the same embodiment. Furthermore, the particular features, structures, or characteristics in one or more embodiments may be combined in any suitable manner, as would be apparent to one of ordinary skill in the art from this disclosure.

Similarly, it should be appreciated that in the description of the exemplary embodiments, various features of the disclosed technology are sometimes grouped together in a single embodiment, figure, or description for the purpose of streamlining the disclosure and aiding in the understanding of one or more of the various inventive aspects. This method of disclosure, however, is not to be interpreted as reflecting an intention that the claimed disclosed technology requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosed technology.

Furthermore, while some embodiments described herein include some but not other features included in other embodiments, combinations of features of different embodiments are within the scope of the disclosed technology, and are meant to form different embodiments, as would be understood by those skilled in the art. For example, in the following claims, any of the claimed embodiments can be used in any combination.

It should be noted that the use of particular terminology when describing certain features or aspects of the disclosed technology should not be taken to imply that the terminology is being re-defined herein to be restricted to include any specific characteristics of the features or aspects of the disclosed technology with which that terminology is associated.

In the description provided herein, numerous specific details are set forth. However, it is understood that embodiments of the disclosed technology may be practiced without these specific details. In other instances, well-known methods, structures, and techniques have not been shown in detail in order to not obscure an understanding of this description.

Reference to monolithic integration herein means integration of components directly on a single base material (substrate), using wafer-scale processes including—but not limited to—(epitaxial) deposition, lithography, etching, chemical-mechanical polishing.

In a first aspect, the disclosed technology relates to a III-V semiconductor nanoridge waveguide structure. Such a structure typically has a narrow supporting base with a freestanding wider body portion on top, as described above. The III-V waveguide comprises a PIN diode. According to some embodiments, the waveguide comprises a III-V semiconductor waveguide core formed in the freestanding wider body portion and at least one heterojunction incorporated in the III-V semiconductor waveguide core. The at least one heterojunction(s) may be one or more active quantum wells or quantum dots, or it may be a heterojunction between bulk materials. The waveguide also comprises a bottom doped region of a first polarity positioned at a bottom of the narrow supporting base forming a lower contact, and an upper doped region of a second polarity forming an upper contact. Structures according to some embodiments are characterized in that the upper contact is positioned in at least one side wall of the freestanding wider body portion. Reference to a side wall herein means a wall not substantially facing the narrow supporting base. The side wall may make an average angle larger than 45° with respect to the plane of the substrate whereon the III-V semiconductor nanoridge waveguide is grown. According to some embodiments, upper contacting may be performed only at a side wall of the freestanding wider body portion. In other embodiments, contacting may be performed both at one or more side walls of the freestanding wider body portion combined with contacting at a top wall of the freestanding wider body portion.

The polarity of the upper contact may depend on the orientation of the PIN diode formed. In some embodiments, the upper contact is a n-type contact and the lower contact is a p-type contact. The n-type contact may be a contact fin from n+ implanted silicon. The p-type contact may be a contact implemented in an in-situ p+ doped, low bandgap, III-V semiconductor fin. In other embodiments, the upper contact is a p-type contact and the lower contact is a n-type contact. The p-type contact may be a contact fin from p+ implanted silicon. The n-type contact may be a contact implemented in an in-situ n+ doped, low bandgap, III-V semiconductor fin.

Nevertheless, it will be clear that other materials also may be used to manufacture the contacts The freestanding wider body portion may have a substantially square shape or a rectangular shape, or other shapes such as a diamond shape, curved shapes, etc. By way of illustration, embodiments of the disclosed technology not being limited thereto, a number of examples of possible shapes of the freestanding wider body portion are shown in FIG. 1, in combination with a number of examples of upper contacts. In FIG. 1, a plurality of portions of waveguides is shown. The freestanding wider body portion 102 with particular shapes are shown, as well as an upper contact 122 being present at least at one side wall of the freestanding wider body portion 102 (i.e. at least one side that is not the wall parallel with the substrate).

In some embodiments, the waveguide may be a III-V semiconductor waveguide, such as GaAs waveguides with InGaAs quantum wells, InAs and InGaAs quantum dots, InGaAs/GaSbAs transitions, or InGaNAs quantum wells; InP waveguides with InGaAs quantum wells, InGaAsP quantum wells, InAs quantum dots, or AlGaInAs quantum wells; InAs with InGaSbAs quantum wells; or GaSb with InGaSbAs quantum wells. The quantum wells and quantum dots thereby are strained to the lattice constant of the waveguide material. Depending on the materials used, specific wavelength ranges can be used in the photonic device, as shown in TABLE 1. The III-V semiconductor waveguides may be implemented as nanoridges.

TABLE 1

| possible III-V materials | | |
|---|---|---|
| III-V semiconductor waveguide | Active material (providing optical gain) | Emission wavelength |
| GaAs | InGaAs quantum wells: In content >25% | 1120 nm~1350 nm |
| | InAs quantum dots | 1120 nm~1350 nm |
| | InGaAs/GaSbAs type II transition | 1120 nm~1400 nm |
| | InGaNAs quantum wells: dilute nitrides | 1250 nm~1600 nm |
| InP or InGaAs | InGaAs quantum wells: In content >30% | 1250 nm~1600 nm |
| | InGaAsP quantum wells | 1250 nm~1700 nm |
| | InAs quantum dots | 1250 nm~1700 nm |
| | AlGaInAs quantum wells | 1250 nm~1700 nm |
| InAs | InGaSbAs - different composition in barrier and quantum well | 1550 nm~5000 nm |
| GaSb | InGaSbAs - different composition in barrier and quantum well | 1550 nm~5000 nm |

Figure 2:
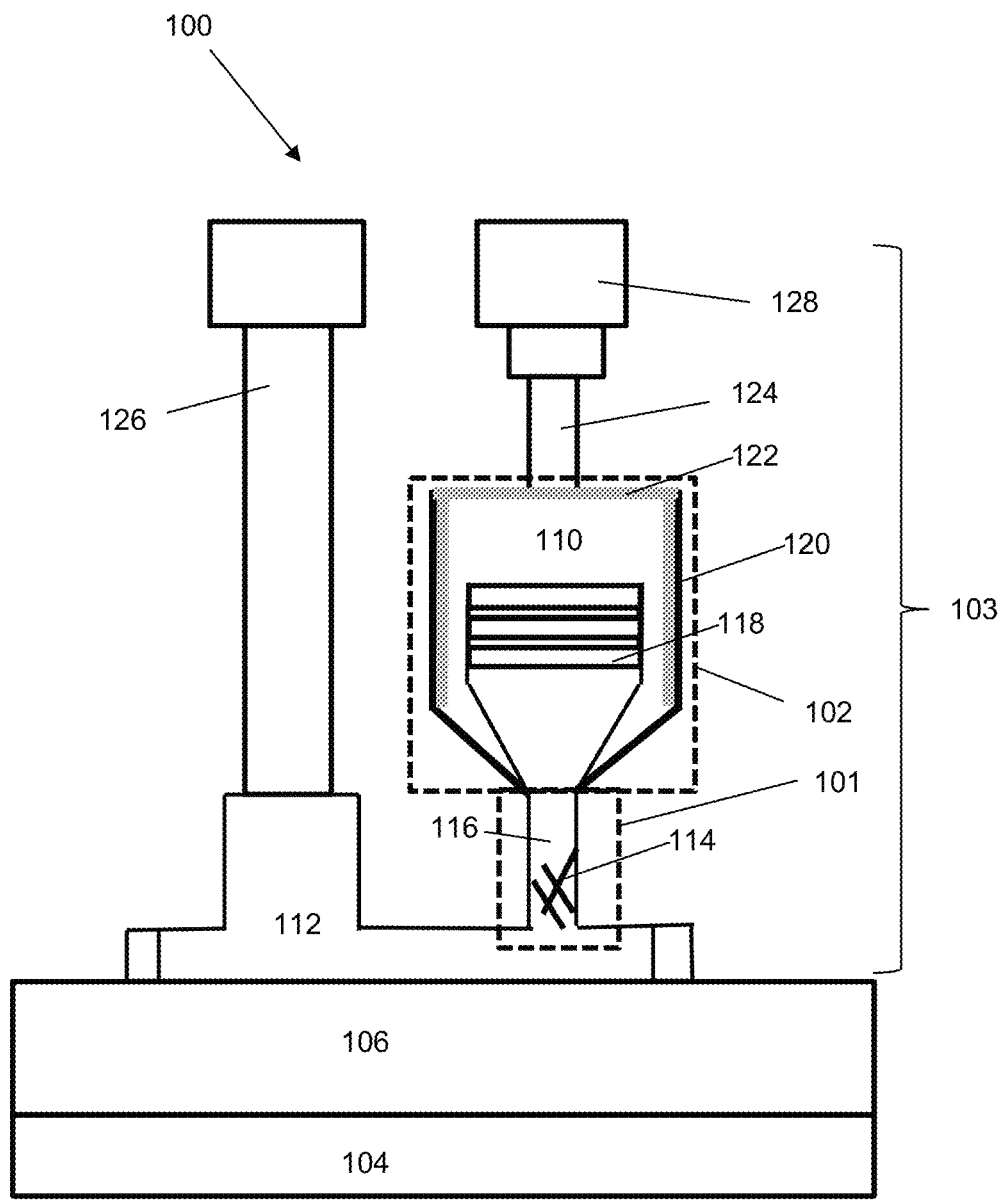
FIG. 2 illustrates an exemplary III-V semiconductor nanoridge waveguide, according to an embodiment of the disclosed technology.

By way of illustration, embodiments of the disclosed technology not being limited thereto, an exemplary III-V waveguide is shown in FIG. 2. FIG. 2 shows a III-V waveguide 100 being a nanoridge structure. The III-V semiconductor waveguide comprises a narrow supporting base 101 and a freestanding wider body portion 102. The waveguide 100 comprises a PIN diode 103, e.g. a vertical PIN diode.

In the example shown in FIG. 2, the III-V waveguide 100 is formed on a substrate comprising a plurality of layers 104 and 106. In the present example, the III-V waveguide 100 is grown on a N+ doped GaAs layer 116 comprising crystal defects 114, itself grown on a N+ doped silicon layer 112 acting as a bottom contact 112 in a n+ implanted silicon fin on the substrate. The N+ Si and N+ GaAs regions forms the n-type electrode of the III-V semiconductor p-i-n diode 103. The III-V waveguide 100 in the present case is III-V waveguide core 110 made of a non-intentionally doped (intrinsic) GaAs material and comprising at least one heterojunction 118, in the present example being one or more InGaAs quantum wells. The III-V waveguide 100 furthermore comprises a passivation layer 120, in the example being an InGaP layer. In the example, the III-V waveguide 100 further comprises, on the upper side of the III-V waveguide 100, a GaAs layer 122 as well as a P+ doped GaAs layer 124, acting as the p-side electrode of the III-V semiconductor p-i-n diode 103. This upper contact 122 is a p-type contact implemented as in-situ p+ doped, low-bandgap, III-V contact fin. According to some embodiments, the upper contact 122 is provided in at least one side wall of the freestanding wider body portion 102. Based on the above description to employ an upper contact 122 and a bottom contact 112 implemented as narrow fins, low resistance contacts are provided, causing no significant optical excess loss to the III-V waveguide 100. The active waveguide 100 is at the upper side and is provided with contact plugs 126 as well as metal interconnects 128, e.g. Cu, to contact the p-i-n diode 103.

By way of illustration, embodiments not being limited to the specific sizes mentioned, TABLE 2 illustrates possible dimensions of the different elements of the III-V waveguide.

TABLE 2

| Width N + GaAs | 20 nm-100 nm |
|---|---|
| Height N + GaAs | 100 nm-400 nm |
| Height GaAs waveguide | 200 nm-1000 nm |
| Width GaAs waveguide | 50 nm-500 nm |
| Width GaAs top layer | 200 nm-600 nm |
| Height top electrode | 100 nm-500 nm |
| Width doped GaAs(+) layer | 20 nm-100 nm |

In a second aspect, the disclosed technology relates to a photonic device comprising a III-V semiconductor nanoridge waveguide according to an embodiment of the first aspect. The photonic device may comprise a substrate whereon the III-V semiconductor nanoridge waveguide is grown. The substrate used as a starting substrate may be a semiconductor substrate or a semiconductor-on-insulator substrate, such as a silicon-on-insulator substrate, although embodiments are not limited thereto. The semiconductor substrate may be SOI, Si, Ge, SiGe, etc. The substrate may be a patterned semiconductor substrate. The device may comprise narrow trenches, with widths ranging from 20 nm to 500 nm and heights ranging from 100 nm to 500 nm, from which the III-V semiconductor waveguide is monolithically grown.

In the photonic device, an active III-V semiconductor waveguide may be monolithically co-integrated with passive and active silicon/silicon-nitride waveguide devices. The III-V/silicon semiconductor device is such that both waveguides are formed directly on a single semiconductor substrate, e.g. a substrate comprising a single silicon layer. The photonic device thus may be a monolithic integrated active/passive waveguide photonic device, comprising an active and a passive waveguide, and being configured to couple radiation between the passive waveguide and the active III-V semiconductor waveguide. It thereby is an advantage of disclosed technology that the silicon passive waveguide of the active/passive structure can be made using the same processing steps as further silicon waveguides that may be present in the silicon photonics platform, such as Si/SiN passive devices and Si active devices using carrier depletion or carrier injection in Si p-n junctions. Nevertheless, It is to be noted that the passive waveguide is not limited to silicon and that other passive waveguides, such as GeSi or germanium waveguides, could be used.

In other positions on the substrate, other devices, both active silicon devices and passive silicon devices, may be present as well.

Further by way of illustration, embodiments of the disclosed technology not being limited, the photonic systems may be used in different optical or electro-optical devices.

In one embodiment, the photonic system may comprise a semiconductor optical amplifier having a III-V semiconductor nanoridge gain waveguide coupled to passive waveguides using 100% evanescent couplers.

In another embodiment, the photonic system may be used in a laser diode. The photonic system may then comprise a semiconductor optical amplifier, e.g. as described above, with optical gain provided by the forward-biased III-V semiconductor p-i-n waveguide and optical feedback provided by optical mirrors implemented in the III-V semiconductor waveguide or in the passive waveguide(s), e.g. silicon waveguide(s).

In yet another embodiment, the photonic system may be an electro-absorption modulator, comprising, for example, a reverse-biased III-V semiconductor p-i-n absorption waveguide coupled to a passive waveguide, e.g. a silicon waveguide, using 100% evanescent couplers.

In still another embodiment, the photonic system may be a photodetector comprising, for example, a reverse-biased III-V semiconductor p-i-n absorption waveguide coupled to a passive waveguide, e.g. a silicon waveguide, using 100% evanescent couplers.

In yet another embodiment, the photonic system may be an optical transceiver implementation, wherein co-integration is obtained of a laser diode, an electro-absorption modulator, a semiconductor optical amplifier, and a photodetector with individually optimized III-V gain/absorption properties and interconnected through passive and active waveguide devices, e.g. silicon waveguide devices.

In a further aspect, the disclosed technology relates to a method of manufacturing a photonic device comprising a III-V semiconductor nanoridge waveguide. The method may be especially suitable for manufacturing a system as described in the first aspect. The method comprises the steps of providing a substrate and monolithically integrating, on the substrate, a III-V semiconductor nanoridge waveguide. The monolithic integration comprises growing a freestanding wider body portion of III-V semiconductor material and at least one heterojunction forming one or more active quantum wells or quantum dots incorporated therein, and growing a doped layer on at least a side wall of the freestanding wider body portion to form a contact on the freestanding wider body portion. Growing a doped layer may comprise epitaxially growing a layer at least partly wrapping the freestanding wider body portion.

By way of illustration, embodiments of the disclosed technology not being limited thereto, an exemplary method of fabrication is described with reference to FIG. 3 through FIG. 19, illustrating different steps in more detail. Nevertheless, multiple additional processing steps may be inserted alternatively or some processing steps may be skipped, for example in order to achieve good coupling means between an active direct bandgap III-V semiconductor nanoridge waveguides and passive silicon waveguides monolithic integrated in an integrated photonic circuits and devices. The method is illustrated with reference to a silicon photonic system. It should be understood that embodiments are not limited thereto.

In a first step, monocrystalline silicon or silicon nitride layers are patterned to define a plurality of passive waveguide structures. These passive waveguide structures may be the basis for more complex photonic devices, such as Mach-Zehnder interferometers, splitters and combiners, microring resonators, waveguide cavities, grating couplers, tapers, or may even be part of active silicon devices, such as integrated heaters, modulators, photodiodes, phase-shifters, etc., after supplementary processing steps. The silicon or silicon nitride structures formed based in the silicon or silicon nitride layer are part of the active/passive waveguide structure, and may be part of a passive silicon device or an active silicon device.

Figure 3:
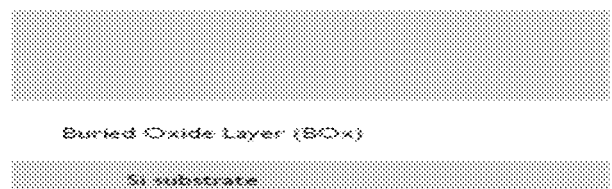
FIGS. 3 to 19 illustrates different steps in the production of an exemplary III-V semiconductor nanoridge waveguide, according to an embodiment of the disclosed technology.
Figure 4:
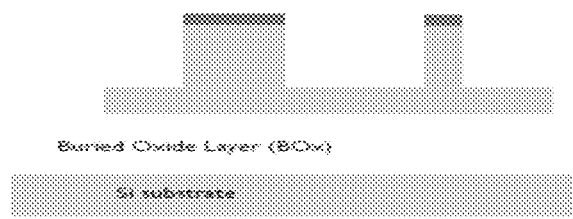

The process can be started from a silicon on insulator substrate. In other embodiments, silicon nitride can be deposited using CVD processing on top of an underlying buried silicon oxide layer and may be 200 nm to 600 nm thick. Other passive layers for patterning are also possible. The patterning step defining the waveguide structures includes the exposure of a photosensitive mask, its development, and a chemical etch step, which together form a lithographic patterning step to selectively open areas in the substrate layer. In some embodiments, this lithographic patterning step is repeated, so as to obtain defined waveguide structures comprising different etch depths, e.g. fully etched ridge waveguides or partially etched shoulders of a rib waveguide. FIG. 3 is showing the substrate and buried oxide layer as well as the silicon or silicon nitride substrate layer. FIG. 4 shows the patterning of the silicon or silicon nitride substrate layer.

In a second step, the remaining photosensitive material is removed and the etched parts of the patterned substrate layer are filled with silicon oxide or any other suitable isolating material and the resulting surface is planarized, e.g. by chemical-mechanical polishing, to a height level which coincides with the top level of the substrate layer.

Figure 5:
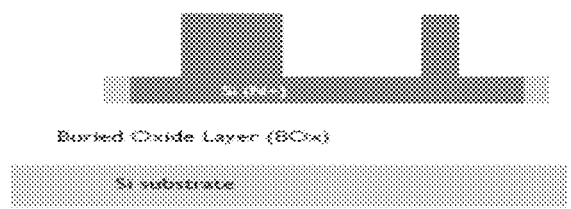

In a third step, dopants are implanted locally into the well-defined regions of the waveguide structures that were patterned into the silicon substrate layer. The latter is illustrated in FIG. 5. The dopants may be donors or acceptor impurity species with the effect of locally changing the doping level and therefore locally modifying the majority carrier concentrations within the silicon waveguide regions. The implanted dopants may require a subsequent activation step, which is achieved through, for example, rapid thermal processing. In the some embodiments, a phase-shifter or modulator may require a pn-junction or pin-junction type interface in order to achieve carrier injection or depletion into or out of a silicon waveguide core, thereby influencing its absorption coefficient or refractive index. Such a junction may be formed by implanting dopants into a first and second shoulder of a silicon rib waveguide so as to obtain a first, n+ doped, region and a second, p+ doped, region adjacent to the silicon core region.

In some embodiments, a lower contact fin of the final active, direct bandgap, III-V semiconductor nanoridge waveguides may be a thin n+ doped silicon fin, preferably between 20 nm to 100 nm wide, and patterned into the silicon substrate such that it does not reach the buried oxide layer underneath the silicon substrate layer. Instead, such a n+ doped contact fin is defined on top of a thin, typically 100 nm high, basis of residual n+ doped silicon, the residual n+ doped silicon being in contact with an adjacent n+ doped silicon rib structure at one side. The lower n+ doped silicon contact fin of the final active, direct bandgap, III-V semiconductor nanoridge waveguides typically has heights in the range of 100 nm to 400 nm. In such an embodiment, the the n+ doped silicon fin is adjacent to, but not in electrical contact with a dopant-free silicon waveguide at the other side, from which it is separated by a silicon oxide filled, typically 50 nm to 800 nm wide, gap as measured between the center of the n+ doped fin and the closest outer edge of the dopant-free silicon ridge waveguide. In such an embodiment, the dopant-free silicon ridge waveguide is typically 100 nm to 1000 nm wide and 200 nm to 500 nm high, but other geometric shapes and dimensions may be selected for other purposes too.

Figure 6:
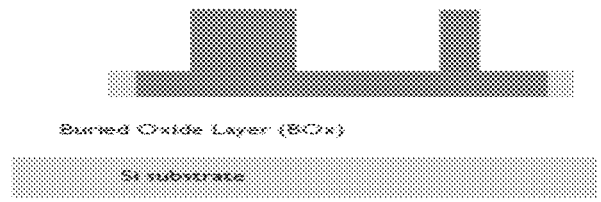

In a fourth step, a thin dielectric liner layer, e.g. a thin silicon oxide layer, is deposited on top of all the preceding layers. FIG. 6 illustrates deposition of an oxide liner.

Figure 7:
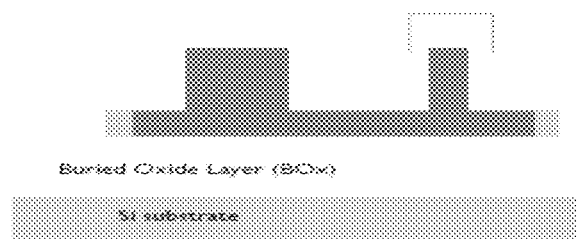

In a fifth step, recesses are formed locally into the thin silicon oxide liner layer, removing completely the deposited silicon oxide liner layer in regions where the lower n+ doped silicon contact fins are located. Typically the width of the recess exceeds the width of the exposed lower n+ doped silicon contact fins. In FIG. 7, the formation of the local oxide recess is shown.

Figure 8:
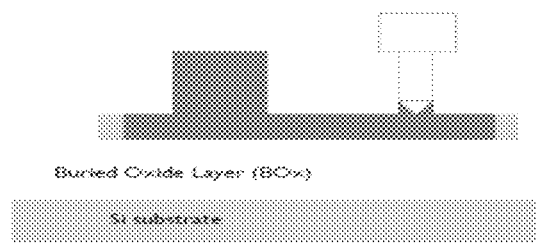

In a sixth step, the so exposed n+ doped silicon contact fins of the previous step are anisotropically wet etched, e.g. by addition of the wet etchant tetramethylammonium hydroxide (TMAH). In FIG. 8, the application of a TMAH wet silicon fin recess etch is illustrated. It is an advantage of the disclosed technology that the choice of the wet etchant, the etchant's concentration and temperature can be controlled so as to achieve smooth, V-shaped, etching of silicon seed surfaces having free {111} facets after the anisotropic wet etch step, which reduces defect formation and excludes the existence of antiphase domain formation upon epitaxial growth of III-V materials on those seeding silicon surfaces. In some embodiments, the tips of the V-shaped silicon surface pointing toward the substrate may be located at a height level that corresponds to the height of the top level of the residual n+ doped silicon substrate layer of the unetched, lower, n+ doped silicon contact fins. In such embodiments, the thin trenches in the silicon oxide layer that form as a result of the wet etch step have their depths maximized and enable high aspect ratios exceeding one, preferably in the range from five to twenty-five. Such trenches of high aspect ratios have the advantage of trapping misfit and dislocation defects efficiently as soon as III-V materials are epitaxially grown inside them. The trench side walls may be angled in embodiments.

Figure 9:
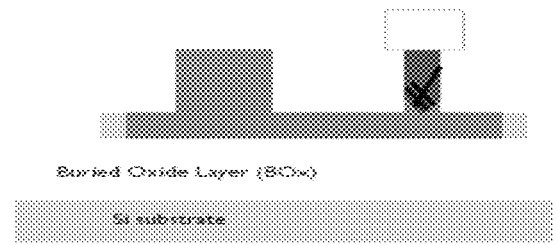

In a seventh step, a bottom n+ doped, direct bandgap, III-V material layer, e.g. n+ doped GaAs, is grown epitaxially inside the high aspect ratio trenches from which the n+ doped silicon was removed by an anisotropic wet etch in the previous step. The latter is shown in FIG. 9. Doping the III-V material layer will improve its contact properties as the n+ doped, direct bandgap, III-V material layer epitaxially grown inside the narrow trenches is still forming the lower n+ doped contact fin of the final active, direct bandgap, III-V nanoridge waveguide. In some embodiments, well-studied epitaxial deposition techniques such as low pressure metal organic vapor phase epitaxy (MOVPE), may be used to grow the n+ doped, direct bandgap, III-V material layer. This has the advantage that the fabrication process is well established and controlled, based on existing results for this advanced processing technique, and does not require a high vacuum environment as needed by other epitaxy techniques, e.g. molecular beam epitaxy. Known metal organic precursors like TMGa and TBAs may be introduced into a 300 mm MOVPE chamber operating at pressures in the range of 20-100 torr for this purpose, and molecular hydrogen gas may act as carrier gas. Furthermore, well-known and commonly used III-V materials, such as doped or intrinsic GaAs, InGaAs, InP, etc., may be used during this epitaxy step, even though there exists an important lattice mismatch between these III-V materials and silicon. It is an advantage of the disclosed technology that the problem of lattice mismatch and the related problems of misfits, threading dislocations, and planar defects, are reduced since those misfits, defects, and dislocations are trapped at the trench side walls. The deeper and narrower the trenches are and the higher the aspect ratio of the trenches is, the better the chances are to trap almost all the defects, misfits, and dislocations along the trench side walls. Moreover, it is an advantage of the disclosed technology that the direct bandgap III-V material layer is first seeded on V-shaped silicon surfaces whose facets are oriented {111} crystal planes; the growth on {111} silicon crystal planes excludes the formation of antiphase domain boundaries.

The epitaxial growth of the direct bandgap III-V material layer, e.g. n+ doped GaAs, inside the narrow trenches as described in the seventh step typically involves a sequence of several sub-steps. In a first sub-step, a closed and uniform seed layer of n+ doped GaAs is formed on the V-shaped {111} silicon crystal planes as a result of a first low temperature 2D nucleation process typically taking place at 350° C.-450° C., e.g. at 360° C. In a second sub-step, increasing the first temperature to a second temperature, which may vary between 500° C.-650° C., lead to some reflow of the seed layer which, however, stays closed. In a third sub-step, material overgrowth takes place at the second high temperature and the narrow trenches are filled by the same or a different III-V material. In some embodiments, it may be advantageous to grow InGaAs on top of the GaAs seed layer and to extend the overgrowth beyond the top level of the narrow trenches.

Figure 10:
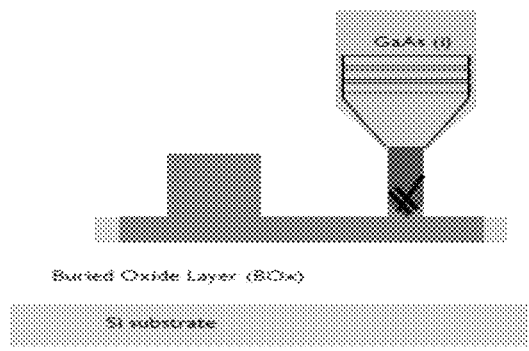

In an eighth step, one or more III-V materials are overgrown on top of the trench filling III-V material, wherein the growth temperatures depend on the selected III-V materials during the overgrowth. This overgrowth starts at the upper level of the narrow trenches where the recess in the silicon oxide liner layer may be wider than the trench itself. In some embodiments, intrinsic GaAs may be grown on top of the trench filling, n+ doped, GaAs lower contact fin, so as to form the body portion of the final active III-V nanoridge waveguide. It is an advantage of disclosed technology that the overgrown III-V materials, e.g. the GaAs box-like portion, are completely relaxed and have free-standing lattice constants, which facilitates their use as buffer for the integration of hetero-layers, e.g. multiple stacked quantum well structures. This is shown in FIG. 10. Moreover, it is an advantage of the disclosed technology that various shapes of the overgrown III-V material can be obtained, depending on the selected process parameters such as growth temperature, partial pressure of the precursors, III/V ratio of the precursors, reactor pressure, pattern mask ratio, selective area growth rate, growth rates of different III-V compositions and of their respective crystal planes, etc. Shapes may be of triangular, box-like, diamond-like, or ridge-like cross-section with a hat-like or a flat top surface. For instance, the upward directed Ga-rich {111} surface of a GaAs III-V material may be subject to growth conditions favoring this surface over other surfaces, e.g. the downward directed As-rich {111} layer, the {001} top layer, and the {110} side layers; these growth conditions lead to quick formation of flat top surfaces and box-like shapes. These box-like shapes with flat top surfaces are advantageous to the fabrication of the active III-V nanoridge waveguides as they allow for increased III/V volume, efficient modal gain, and waveguiding action outside the contact forming trenches of the nanoridge waveguide. In some embodiments, such a GaAs box-like nanoridge waveguide body portion may be 200 nm to 600 nm wide and 200 nm to 600 nm high, as measured from the top end of the supporting lower contact fin. In some embodiments, the eighth step may further include the integration of multiple hetero-junction layers, e.g. very uniform, surface-flat In(0.2)Ga(0.8)As/GaAs multi-quantum well stacks, on the flat intrinsic GaAs buffer during overgrowth. In such embodiments, the multi-quantum well stacks form the active gain region for a guided optical mode inside the nanoridge waveguide, thus allowing for lasing operation of a laser diode.

Figure 11:
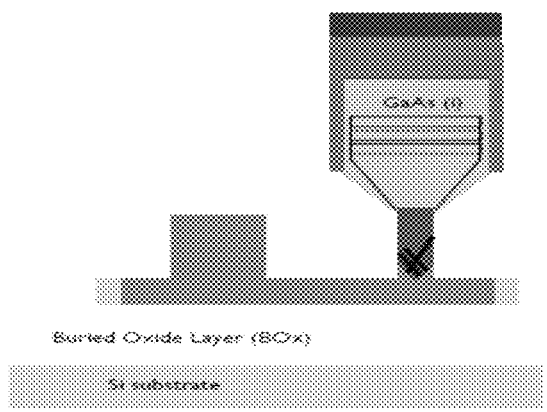

In a ninth step, one or more p-doped III-V material layers, e.g. p-type and p+-type GaAs, are deposited by epitaxial growth in at least one side of the overgrown nanoridge waveguide body portion, which may comprise multi-quantum well stack embedded into it. The latter is shown in FIG. 11. In some embodiments, these doped III-V layers serve as upper contact fins for the active III-V direct bandgap nanoridge waveguides after a subsequent patterning step, and may be 100 nm to 500 nm high.

Figure 12:
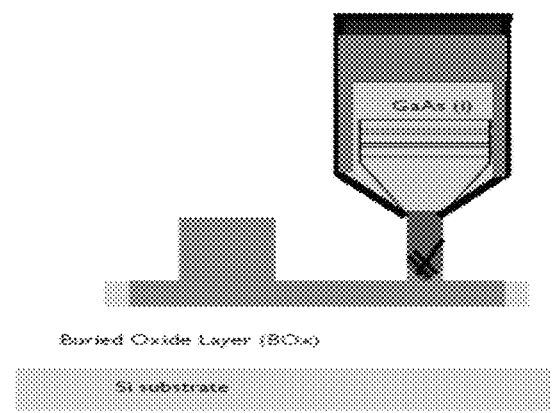

In a tenth step, a III-V material based passivation cap, for instance, InGaP with about 51% In content that is lattice matched to the intrinsic GaAs and grown at about 625° C., may be 20 nm to 70 nm thick and wrap entirely around the overgrown, free-standing body portion of the active III-V nanoridge waveguide. The latter is shown in FIG. 12. In some embodiments, such an encapsulating passivation layer is advantageous as it enhances carrier confinement under electrical pumping and reduces non-radiative surface recombination effects.

Figure 13:
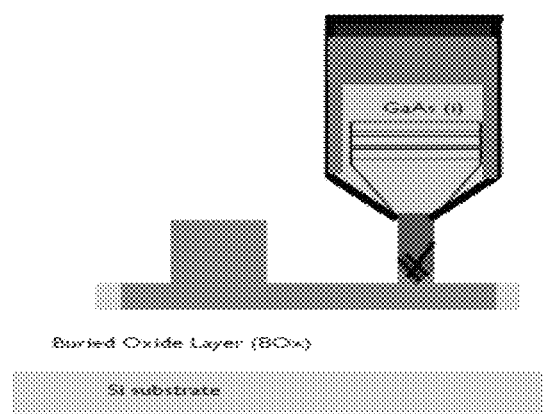

In an eleventh step, a pre-metal dielectric layer, e.g. a silicon oxide layer, is deposited onto the entire area covering all the structures obtained in previous steps. The latter is shown in FIG. 13.

Figure 14:
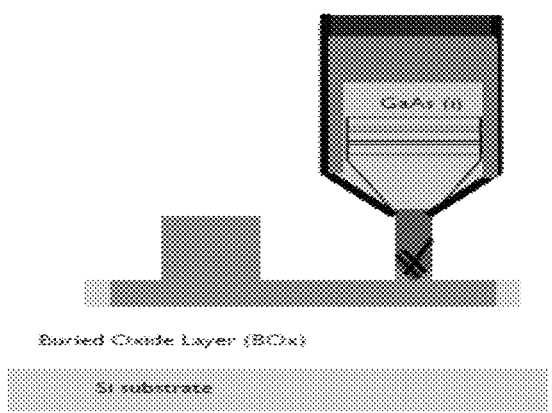

In a twelfth step, the pre-metal dielectric layer of the previous step is planarized, e.g. by chemical-mechanical polishing, and etched back to the level of the top surface of the nanoridge III-V passivation layer. The latter is shown in FIG. 14.

Figure 15:
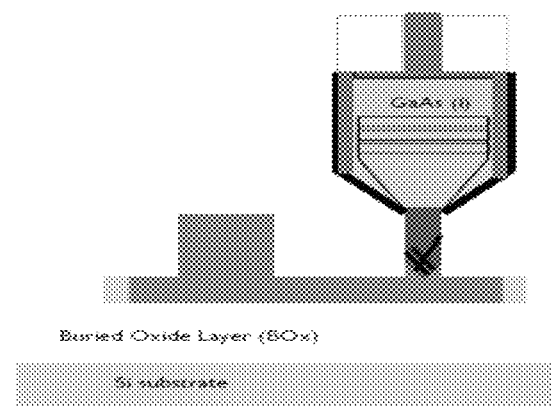

In a thirteenth step, the top III-V passivation layer of the active direct bandgap III-V material nanoridge waveguide is removed, e.g. through etching, as shown in FIG. 15.

Figure 16:
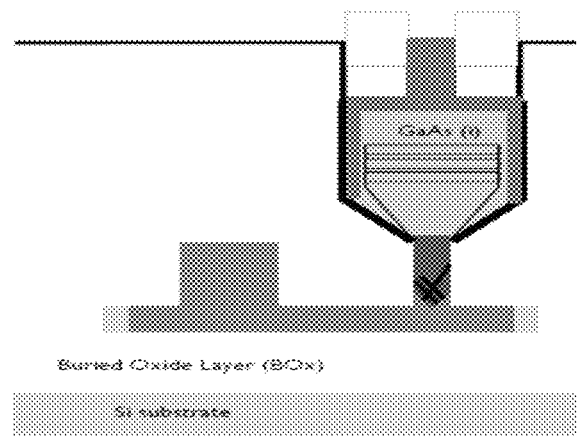
Figure 17:
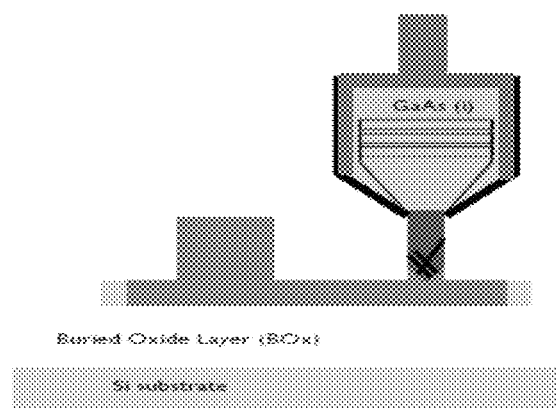

In a fourteenth step, the one or more p-doped III-V material layer(s) of the ninth step, e.g. the p-type and p+-type GaAs layers, are selectively etched to form narrow top contact fins to the active III-V material nanoridge waveguides. The top contact fins may have widths between 20 nm to 100 nm. In some embodiments, an additional top passivation layer may be applied to the current material stack. The latter is shown in FIG. 16 and FIG. 17.

In a fifteenth step, again a pre-metal dielectric layer is deposited on top of the current material stack, followed by a planarization process.

Figure 18:
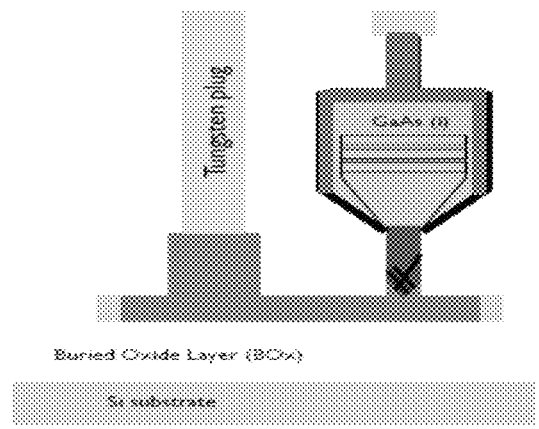

In a sixteenth step, contact plugs, e.g. tungsten contact plugs, are formed on defined regions of the patterned and doped silicon substrate layer of step three and the top contact fin of the fourteenth step, by selectively removing the pre-metal dielectric layer of the previous step and selectively depositing the contact metal inside the resulting gaps. The latter is shown in FIG. 18. In some embodiments, this step ensures electrical contacting of the active nanoridge devices.

Figure 19:
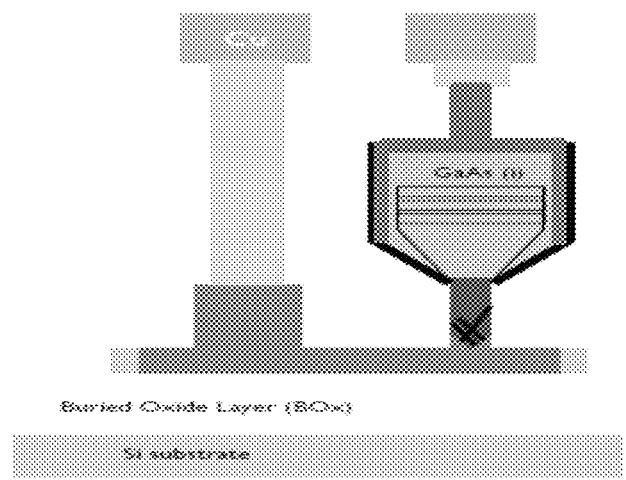

In a seventeenth step, metal interconnects, e.g. copper damascene pads, are provided to the material stack in regions where the contact plugs exist, by first selectively patterning an underlying insulating oxide layer, then applying an overfilling metallization layer, and finally removing the excess metal by planarization, e.g. chemical-mechanical planarization. The latter is illustrated in FIG. 19.

By way of illustration, embodiments of the disclosed technology not being limited thereby, some simulations results are further discussed, illustrating features and advantages of embodiments of the disclosed technology.

Figure 20:
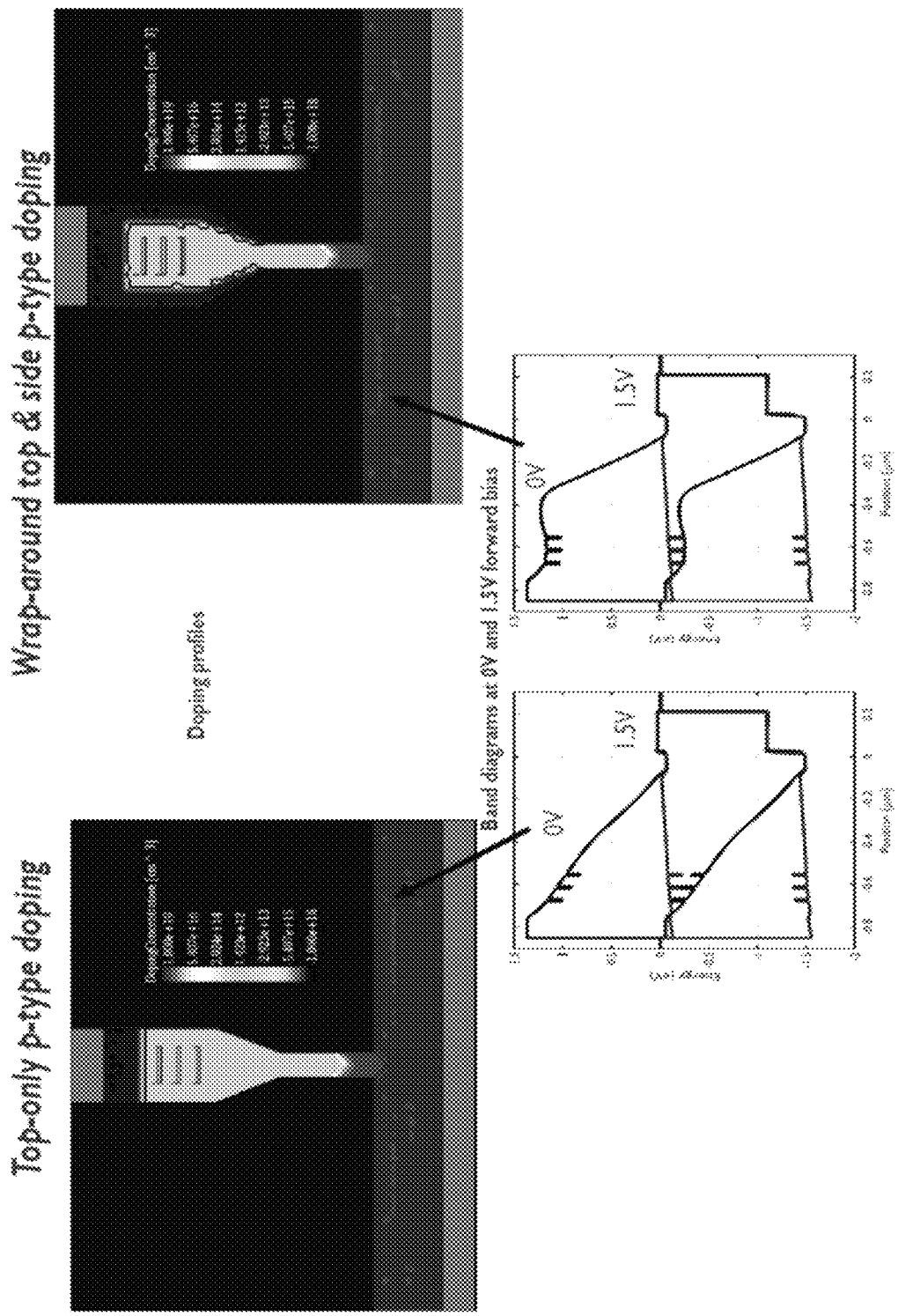
FIG. 20 illustrates band diagrams at 0V and 1.5V forward bias for a top electrode and a wrapping around electrode in a III-V semiconductor nanoridge waveguide, illustrating features and advantages of embodiments of the disclosed technology.
Figure 21:
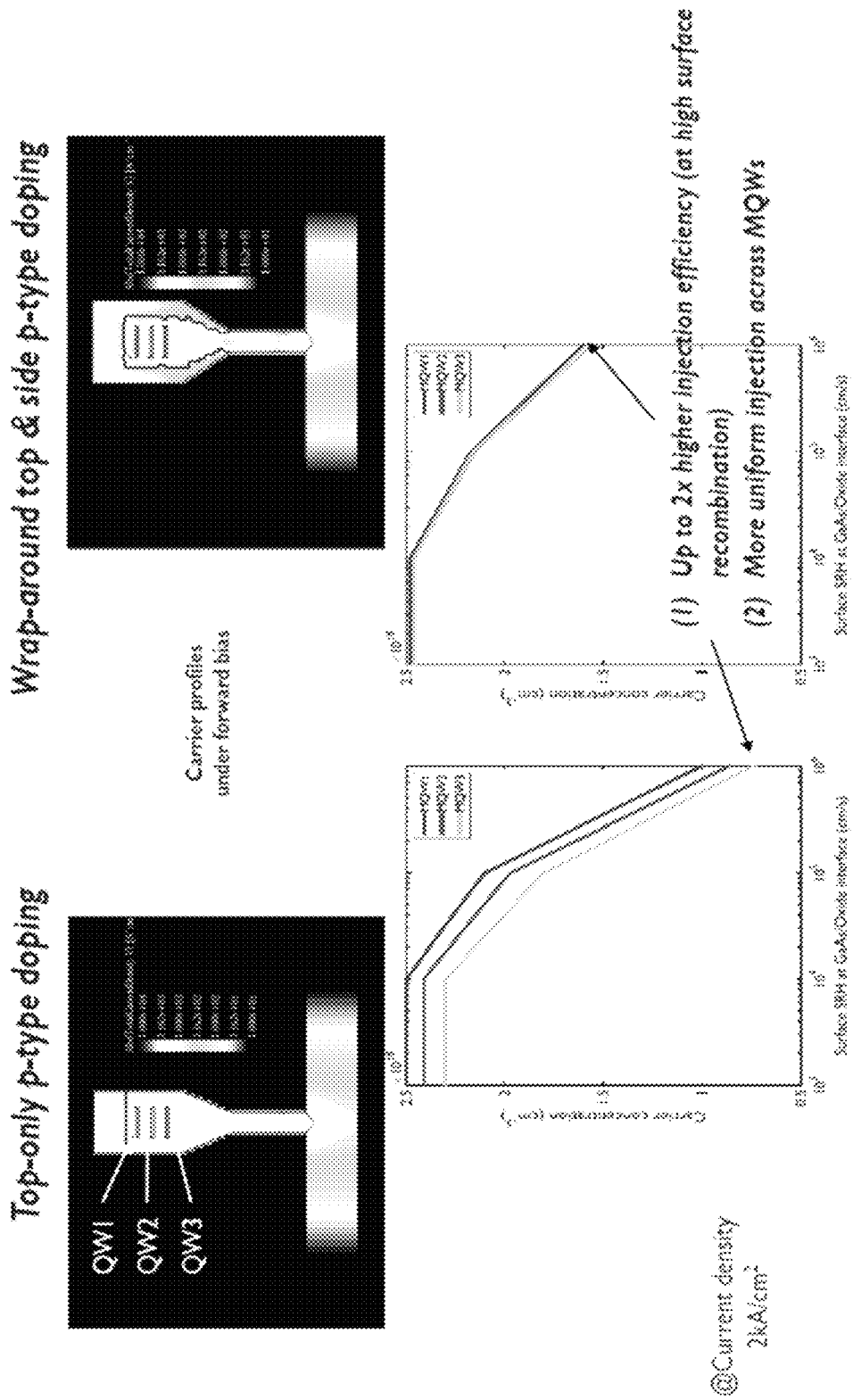
FIG. 21 illustrates carrier profiles under forward bias for a top electrode and a wrapping around electrode in a III-V semiconductor nanoridge waveguide, illustrating features and advantage of embodiments of the disclosed technology.

A simulation was performed to compare the III-V semiconductor nanoridge waveguide with a top electrode as known from prior art and a III-V semiconductor nanoridge waveguide with an upper electrode wrapping around the freestanding wide body portion. The corresponding band diagrams are shown in FIG. 20. In FIG. 21, the carrier profiles under forward bias are shown, both for the case of a top electrode only (according to prior art) and a wrapping around electrode. It is seen that an injection efficiency is obtained up to twice as high for a wrapping around electrode, compared to the top electrode only case. Furthermore, it is noted that a more uniform injection is obtained across the multi quantum wells.

While the invention has been illustrated and described in detail in the drawings and the foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the embodiments.

What is claimed is:

1. A III-V semiconductor waveguide, the III-V semiconductor waveguide being a nanoridge structure having a narrow supporting base with a freestanding wider body portion on top, having a PIN diode, and comprising:
   a III-V semiconductor waveguide core formed in the freestanding wider body portion;
   at least one heterojunction incorporated in the III-V semiconductor waveguide core;
   a bottom doped region of a first polarity positioned at a bottom of the narrow supporting base, forming a lower contact;
   a V-shaped interface between the narrow supporting base and the lower contact; and
   an upper doped region of a second polarity, forming an upper contact, the upper contact being positioned in at least one side wall of the freestanding wider body portion.

2. The III-V semiconductor waveguide according to claim 1, wherein
   the at least one heterojunction comprises one or more active quantum wells or quantum dots; or
   a heterojunction is formed between bulk materials.

3. The III-V semiconductor waveguide according to claim 2, wherein
   the III-V waveguide core is formed of a material comprising GaAs and the active quantum wells or quantum dots are one or more of the following: InGaAs quantum wells, InAs quantum dots, InGaAs/GaSbAs quantum wells, or InGaNAs quantum wells; or
   the III-V waveguide core is formed of a material comprising InP and the active quantum wells or quantum dots are one or more of the following: InGaAs quantum wells, InGaAsP quantum wells, InAs quantum dots, or AlGaInAs quantum wells; or
   the III-V waveguide core is formed of a material comprising InAs and the active quantum wells or quantum dots are InGaSbAs quantum wells; or
   the III-V waveguide core is formed of a material comprising GaSb and the active quantum wells or quantum dots are InGaSbAs quantum wells.

4. The III-V semiconductor waveguide according to claim 2, wherein the upper contact is positioned in at least a side wall and on a top side of the freestanding wider body portion.

5. The III-V semiconductor waveguide according to claim 2, wherein the upper contact wraps around the region of the waveguide core comprising the at least one heterojunction.

6. The III-V semiconductor waveguide according to claim 2, wherein the upper contact encapsulates the freestanding wider body portion.

7. The III-V semiconductor waveguide according to claim 2, wherein
   the upper contact is an n-type contact and the lower contact is a p-type contact; or
   the upper contact is a p-type contact and the lower contact is an n-type contact.

8. The III-V semiconductor waveguide according to claim 2, wherein the semiconductor waveguide further comprises a planar passivation layer covering at least part of the freestanding wider body portion.

9. The III-V semiconductor waveguide according to claim 1, wherein the upper contact is positioned in at least a side wall and on a top side of the freestanding wider body portion.

10. The III-V semiconductor waveguide according to claim 1, wherein the upper contact wraps around a region of the waveguide core comprising the at least one heterojunction.

11. The III-V semiconductor waveguide according to claim 1, wherein the upper contact encapsulates the freestanding wider body portion.

12. The III-V semiconductor waveguide according to claim 1, wherein
    the upper contact is an n-type contact and the lower contact is a p-type contact; or
    the upper contact is a p-type contact and the lower contact is an n-type contact.

13. The III-V semiconductor waveguide according to claim 12, wherein
    the n-type contact is a contact fin from n+ implanted silicon and/or the p-type contact is a contact implemented in an in-situ p+ doped, low bandgap, III-V semiconductor fin; or
    the p-type contact is a contact fin from p+ implanted silicon and/or the n-type contact is a contact implemented in an in-situ n+ doped, low bandgap, III-V semiconductor fin.

14. The III-V semiconductor waveguide according to claim 1, wherein the semiconductor waveguide further comprises a planar passivation layer covering at least a portion of the freestanding wider body portion.

15. The III-V semiconductor waveguide according to claim 14, wherein the passivation layer fully covers the upper contact.

16. A photonic device comprising the III-V semiconductor waveguide according to claim 1.

17. The photonic device according to claim 16, wherein the photonic device is a monolithic integrated active/passive waveguide, further comprising a passive waveguide, and being configured to couple radiation between the passive waveguide and the active III-V semiconductor waveguide.

18. The photonic device according to claim 17, wherein the passive waveguide is a silicon or silicon nitride waveguide.

19. A method of manufacturing a photonic device comprising a III-V semiconductor waveguide according to claim 1, the method comprising:
    providing a substrate; and
    monolithically integrating, on the substrate, a III-V semiconductor nanoridge waveguide, the monolithic integration comprising:
    growing a freestanding wider body portion of III-V semiconductor material and at least one heterojunction, forming one or more active quantum wells or quantum dots incorporated therein; and growing a doped layer on at least a side wall of the freestanding wider body portion to form an upper contact on the freestanding wider body portion.

20. The method according to claim 19, wherein growing a doped layer comprises epitaxially growing a layer at least partly wrapping the freestanding wider body portion.

21. The III-V semiconductor waveguide according to claim 1, wherein the narrow supporting base has an aspect ratio exceeding 5.

* * * * *